United States Patent [19]

Lemelson et al.

[11] Patent Number: 4,563,770
[45] Date of Patent: Jan. 7, 1986

[54] MEASURING DEVICE AND METHOD

[76] Inventors: Jerome H. Lemelson, 85 Rector St., Metuchen, N.J. 08840; Christian Grund, 2035 Burr Ave., The Bronx, N.Y. 10461

[21] Appl. No.: 81,365

[22] Filed: Oct. 3, 1979

[51] Int. Cl.$^4$ ............................................. G10L 1/00
[52] U.S. Cl. .................................. 381/51; 324/99 D; 364/710
[58] Field of Search ..................... 179/1 SM, 1 SG; 324/99 D; 364/709, 710

[56] References Cited

U.S. PATENT DOCUMENTS

| | | | |
|---|---|---|---|
| 3,081,431 | 3/1963 | Werner et al. | 324/99 D |
| 3,641,496 | 2/1972 | Slavin | 179/1 SM |
| 3,828,252 | 8/1974 | Wolff | 324/99 D |
| 3,998,045 | 12/1976 | Lester | 179/1 SM |
| 4,179,584 | 12/1979 | Tanimoto et al. | 179/1 SM |

Primary Examiner—E. S. Matt Kemeny

[57] ABSTRACT

An electrical measuring instrument, such as a multimeter, for measuring such electrical variables as current, voltage, resistance, impedance, frequency and other variables. The results of such measurement are both displayed and are provided as sounds of words of speech indicating measurements as they are made. A memory temporarily records the results of measurement and provides signals, on demand, for repeating the generation of synthetic speech indicating the results of a measurement. In one form, signals representative of a plurality of different measurements are recorded in the memory and each may be selectively reproduced for display and/or generating synthetic speech indicative of the particular measurement represented thereby. A keyboard forming part of the measuring instrument may be employed for the selective reproduction of signals from the memory as well as for coding the recorded signals so that they may be selectively reproduced from the memory.

11 Claims, 2 Drawing Figures

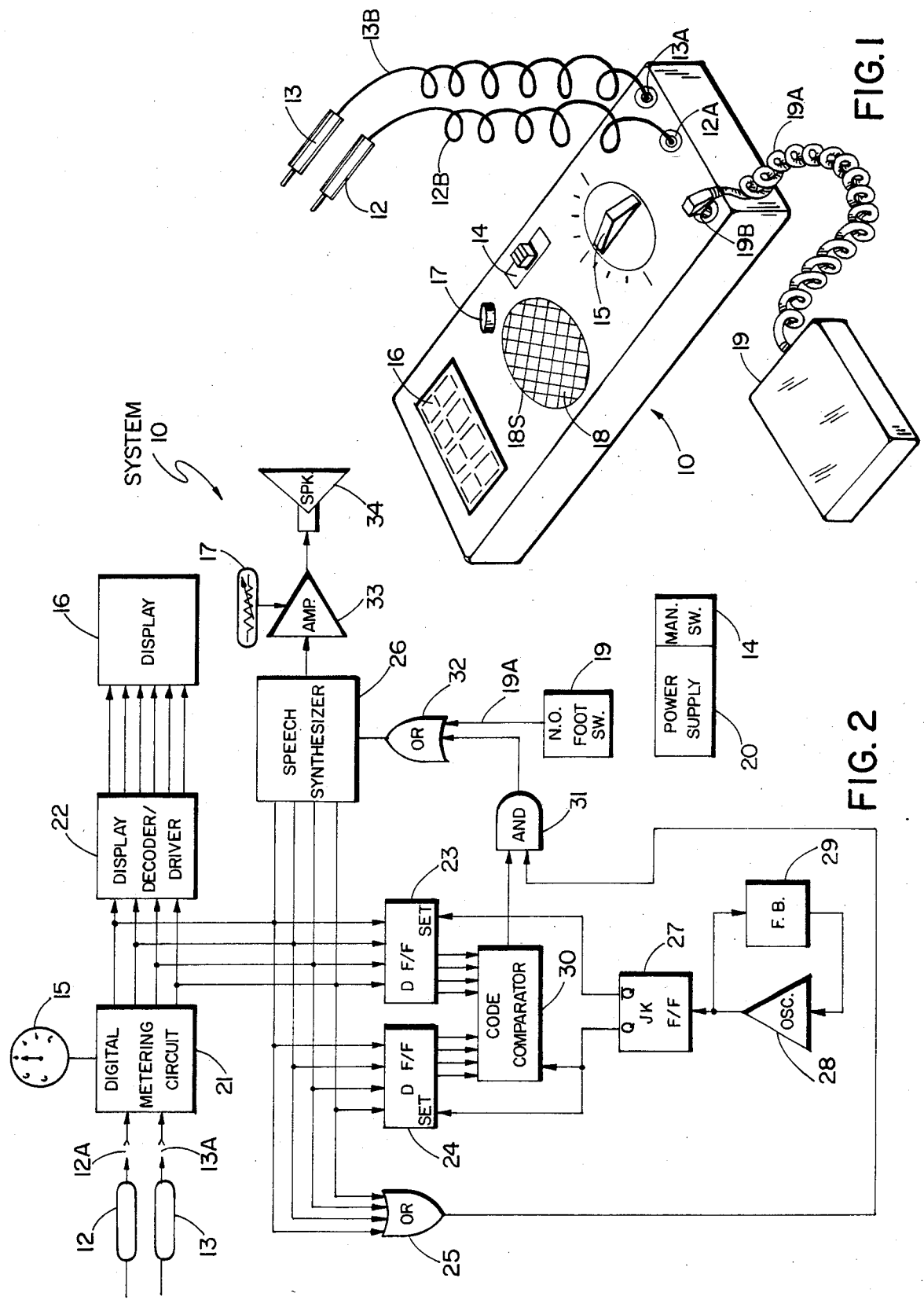

4,563,770

MEASURING DEVICE AND METHOD

SUMMARY OF THE INVENTION

This invention relates to an electrical measuring instrument and a method for effecting and indicating measurements of variables. While the apparatus disclosed is a multi-meter for measuring and indicating electrical variables of an electric circuit or device, the same technique and electronic means for controlling a display and generating synthetic speech of the variable displayed, may be employed to indicate other measurements such as speed, rotational rate, force, torque, pressure, temperature and other variables.

Measuring devices and instruments, such as multimeters and other devices, are known in the art which visually indicate the quantity of a variable measured thereby. While the visual indication of a variable being measured may properly serve the purpose of the measuring device, the user of the instrument may more effectively operate in making measurements therewith, if it is not required to visually read each measurement, wherein the indication of the measurement is attained by speech which is generated synthetically and is controlled by circuits associated with the instrument.

Accordingly it is a primary object of this invention to provide a new and improved apparatus and method for measuring a variable and indicating such variable by either or both audio and visual means.

Another object is to provide a measuring instrument with suitable electronic circuit means for analyzing signals generated in making measurements and applying the results to selectively generate synthetic speech signals for audibly indicating such results.

Another object is to provide an automatic measuring instrument for measuring a variable and providing a numerical indications of measurements made as synthetic speech signals which may be easily converted to speech sounds to permit the user of the instrument to determine the measurement made merely by listening wherein such persons eyes may be used for purposes other than to determine the measurements made.

Another object is provide a measuring instrument which may be used by blind persons with little training.

With the above and such other objects in view as may hereinafter more fully appear, the invention consists of the novel constructions, combinations, arrangements of parts and method for effecting measurements as will be more fully described and illustrated in the accompanying drawings but it is to be understood that changes, variations and modifications may be resorted to which fall within the scope of the invention as claimed without departing from the spirit and nature of the invention.

In the drawings:

FIG. 1 is an isometric view of a measuring instrument; and

FIG. 2 is a schematic diagram of the electronic components and subsystems employed in the instrument of FIG. 1.

In FIG. 1 is shown details of an instrument 10, such as a multimeter, which is capable of both displaying measuremtnts made thereby and generating sounds in the form of synthetic speech, for audibly indicating such measurements. The instrument 10 comprises a plurality of components supported within a housing 11, which may be made of molded plastic and supports electrical input receptacles or jacks 12A and 13A into which receptacles are shown pluggably connected the ends of flexible wires 12B and 13B which extend from respective probes 12 and 13 at the other end of said wires. Housing 11 also accommodates and supports an on/off switch 14, a range switch 15, a digital display 16, such as a light emitting diode (LED) or liquid crystal display (LCD) forming a plurality of character defining units for numerically indicating measurements made by the multimeter circuits thereof. Also supported by the housing 11 are a volume control knob 17, a receptacle 18 for a speaker 18S, a pair of input jacks or receptacles 19B for terminals of a wire pair or cable 19A which connects a normally open foot operated switch 19 in a manner to be described.

In FIG. 2 is shown a schematic diagram of electrical and electronic components of the system 10A contained within and supported by the housing 10 of FIG. 1. A power supply 20, such as a battery which is easily acceptable for replacement and preferably containing an input coupling means for recharging by means of an external source of current in a conventional manner, is controlled to supply power to the various electrical components of the measuring unit when manually operated switch 14 is closed. When probes 12 and 13 are electrically connected or coupled to any circuit, the parameters of which are to be measured by the system 10A, signals indicative of the particular parameter or parameters are conducted through the wires 12B and 13B and the jacks 12A and 13A which extend to respective inputs of a digital metering circuit 21 of typical construction and known in the art, which circuit generates digitally coded signals on its outputs which are representative of the input analog signals received from the probes 12 and 13. Manually operated range switch 15 is employed to select the range of current, voltage, resistance or other variable in which range measurement is to be made.

The digitally coded output of metering circuit 21 is conducted to a display decoder/driver circuit 22 which energizes and drives the electrically activated multiple character display unit 16 and provides a visual representation of the measured parameter. The metering circuit 21 also has its outputs extending to multiple data flip-flop switches 23 and 24, an OR date 25 and a speech synthesizer circuit 26, such as speech synthesizing microelectronic circuit TMC 0280 IC manufactured by the Texas Instruments Corporation of Dallas, Tex. and including suitable support circuitry therefor. The digital information output of circuit 21 is entered into flip-flop switch 23 whenever the $\overline{Q}$ bar output of a JK flip-flop switch 27 is activated, as determined by a clock pulse generated by an oscillator 28, with its attendant frequency determining feedback circuit 29. A subsequent pulse from oscillator 28 causes flip-flop circuit 27 to toggle, activating its Q output, while simultaneously deactivating it's $\overline{Q}$ bar output. This action sets flip-flop circuit 24 to the data presently output from metering circuit 21.

Activation of the $\overline{Q}$ output of the flip-flop circuit 27 in the manner described above, causes a code comparator 30 to compare data output from flip-flop circuit 23 with that of flip-flop circuit 24 providing a time signal to an AND gate 31 if the outputs are equivalent. An OR gate 25 provides a time signal to AND gate 31 whenever any data output from the metering circuit 21 is not zero. Whenever both signals to AND gate 31 are simultaneously present at the inputs of said AND gate, the AND gate 31 is activated triggering speech synthesizer circuit 26 through OR gate 32, which speech synthesizer circuit converts or employs a digitally coded output of circuit 21 to generate a synthetic speech analog signal representative of words defining the numerical value of the measurement made as described. Such synthetic speech analog signal is amplified by an amplifier 33, which has a suitable volume control 17, and then is converted to an audible word or word representation of the measurement when the analog signal activates or modulates a speaker 34. The code comparator 30 is employed to establish that the data output of circuit 21 has settled to a constant value providing information which is reliable.

Normally open foot switch 19 is employed as an operator triggered or controlled switch for effecting generation of synthetic speech which is indicative of the measurement made, when such switch is closed. This feature enables the operator to control or trigger the operation of the speech snythesizer when it is desired to generate audible synthetic speech and also provides the operator with a means for repeating the most recent measurement made by the instrument as synthetic speech sounds in the event that the operator did not properly hear the previous speech indication of the measurement.

We claim:

1. A measuring device comprising:
    a housing,
    a speaker supported by said housing,
    electrical circuit means supported within said housing,
    sensing means connected to said electrical circuit means for sensing a variable to be measured and operable for outputting electrical signals which vary in accordance with variations in the variable sensed,
    said electrical circuit means including a signal processing means for receiving and processing said electrical signals generated by said sensing means,
    said electrical circuit means also including a microminiature solid state electronic synthetic speech signal generating means for generating speech signals of words of numbers,
    said electrical circuit means having means for controlling said synthetic speech generating means including;
        comparator means for receiving electrical signals generated by said signal processing means,
        control means connected to said comparator means for causing synthetic speech signals of words of speech defined by the output of said synthetic speech generating means to be passed to said speaker,
        means for operating said control means to cause selected speech signals defining numbers indicative of a variable sensed to be passed to said speaker when said sensing means senses a true measurement of the variable sensed,
        said control means including a clock pulse generating means operable to control said control means when said sensing means fails to detect and generate signals defining further variations in the variable sense so as to permit said speaker to generate sounds of a train of words defining numbers which are indicative of a measurement made.

2. A measuring device in accordance with claim 1 further including a normally open monostable push-button switch accessible to be closed from the exterior of said housing.

3. A measuring device in accordance with claim 1 wherein said sensing means is supported by said housing.

4. A measuring device in accordance with claim 1 including an electrical display means supported by said housing and operable for displaying the variable sensed as it is sensed and a manually operable switch supported by said housing and connected for controlling said synthetic speech signal generating means to generate synthetic speech signals which are indicative of the measurement displayed by said display means.

5. A measuring device in accordance with claim 1 including a memory for recording information defining a measurement made and manually operable switch means for querying said memory and applying signals indicative of the measurement to said synthetic speech signal generating means to permit a repeat playback of the verbal indication of the measurement after it has been first generated by said speaker.

6. A measuring device in accordance with claim 1 wherein said sensing means is operable to generate analog signals which are indicative of a measurement made and said signal processing means includes a digital metering circuit for generating digitally coded signals representative of the quantitative values of the analog signals generated by said sensing means and means for applying said coded signals to generate said control signals.

7. A measuring device in accordance with claim 6 including a manually operable range switch connected to said digital metering circuit for manually selecting a range of a measured variable in which range a measurement is to be made by said device.

8. A measuring device comprising in combination:
    a housing,
    a source of electrical energy and electrical circuit means connected to be powered by said electrical energy,
    sensing means for sensing a variable to be measured and operable to output electrical signals which vary in accordance with variations in the variable sensed,
    said electrical circuit means supported within said housing and including:
    (a) input means connected to receive the signals output by said sensing means,
    (b) signal processing means including an analog-to-digital conversion means connected to said input means for receiving and processing electrical signals received on said input means and generating digital signals defining the variable sensed,
    (c) microminiature electrical circuit speech signal generating means for generating analog speech signals of words of individual numbers including the numbers, "one" to "nine",
    (d) control means for said microminiature electronic circuit speech signal generating means operable for selectively controlling same to generate synthetic speech signals defining a train of words of said individual numbers in a sequential array which defines a multiple-number quantity,
    (e) control signal generating means operably connected to receive the signals output by said signal processing means and including a memory and a comparator means for comparing signals received from said signal processing means with recordings in said memory and generating a plurality of control signals, and means for applying said control signals to said control means for said speech signal generating means so as to cause said speech signal generating means to generate select digital speech signals in sequence, which digital speech signals define words of speech of a plurality of numbers defining the quantity of the measurement made by said measuring device, and (f) speaker means supported by said housing and connected to receive analog signals defining the output of said synthetic speech signal generating means for transducing such analog signals to sounds of speech as a train of words defining a numerical indication of the measurement made when said sensing means senses a variable.

9. A measuring device in accordance with claim 8 including a manually operable range varying means for selectively varying the range of the variable in which a measurement is to be made.

10. A measuring device in accordance with claim 8 wherein said comparator means is a code signal comparator and said electrical circuit means includes timing means connected to control signals fed to said comparator from said analog-to-digital conversion means.

11. A measuring device in accordance with claim 8 including a digital display operatively connected to be controlled by signals generated on the output of said analog-to-digital conversion means, said display and said speaker means being supported by said housing, said electrical circuit means being supported within said housing.

* * * * *